United States Patent
Mazur et al.

(10) Patent No.: US 7,884,446 B2
(45) Date of Patent: Feb. 8, 2011

(54) FEMTOSECOND LASER-INDUCED FORMATION OF SUBMICROMETER SPIKES ON A SEMICONDUCTOR SUBSTRATE

(75) Inventors: Eric Mazur, Concord, MA (US); Mengyan Shen, Belmont, MA (US)

(73) Assignee: President & Fellows of Harvard College, Cambridge, MA (US)

( * ) Notice: Subject to any disclaimer, the term of this patent is extended or adjusted under 35 U.S.C. 154(b) by 263 days.

(21) Appl. No.: 12/235,086

(22) Filed: Sep. 22, 2008

(65) Prior Publication Data

US 2009/0014842 A1 Jan. 15, 2009

Related U.S. Application Data

(60) Division of application No. 11/196,929, filed on Aug. 4, 2005, now Pat. No. 7,442,629, which is a continuation-in-part of application No. 10/950,248, filed on Sep. 24, 2004, now Pat. No. 7,354,792, and a continuation of application No. 10/950,230, filed on Sep. 24, 2004, now Pat. No. 7,057,256.

(51) Int. Cl.
*H01L 29/06* (2006.01)

(52) U.S. Cl. ............ 257/618; 257/623; 257/E29.106; 257/E29.108

(58) Field of Classification Search .......... 257/618, 257/623, E29.106, E29.108
See application file for complete search history.

(56) References Cited

U.S. PATENT DOCUMENTS

| | | | |
|---|---|---|---|
| 4,181,538 A | 1/1980 | Narayan et al. |
| 4,201,450 A | 5/1980 | Trapani |
| 4,277,793 A | 7/1981 | Webb |
| 4,703,996 A | 11/1987 | Glass et al. |
| 4,965,784 A | 10/1990 | Land et al. |
| 5,635,089 A | 6/1997 | Singh et al. |
| 5,714,404 A | 2/1998 | Mitlitsky et al. |
| 5,773,820 A | 6/1998 | Osajda et al. |
| 6,242,291 B1 | 6/2001 | Kusumoto et al. |
| 6,272,768 B1 | 8/2001 | Danese |
| 6,457,478 B1 | 10/2002 | Danese |
| 6,486,046 B2 | 11/2002 | Fujimura et al. |
| 6,876,003 B1 | 4/2005 | Nakamura et al. |
| 7,057,256 B2 | 6/2006 | Carey, III et al. |
| 7,112,545 B1 | 9/2006 | Railkar et al. |

(Continued)

OTHER PUBLICATIONS

Carey et al., "High Sensitivity Silicon-Based VIS/NIR Photodetectors", CLEO 2004 (San Francisco, CA, 2004) 1-2.

(Continued)

*Primary Examiner*—Ngan Ngo
(74) *Attorney, Agent, or Firm*—Thomas J. Engellenner; Reza Mollaaghababa; Nutter McClennen & Fish LLP

(57) ABSTRACT

The present invention generally provides semiconductor substrates having submicron-sized surface features generated by irradiating the surface with ultra short laser pulses. In one aspect, a method of processing a semiconductor substrate is disclosed that includes placing at least a portion of a surface of the substrate in contact with a fluid, and exposing that surface portion to one or more femtosecond pulses so as to modify the topography of that portion. The modification can include, e.g., generating a plurality of submicron-sized spikes in an upper layer of the surface.

11 Claims, 7 Drawing Sheets

U.S. PATENT DOCUMENTS

| | | | |
|---|---|---|---|
| 7,211,214 B2 | 5/2007 | Chou | |
| 7,390,689 B2* | 6/2008 | Mazur et al. | 438/71 |
| 7,442,629 B2 | 10/2008 | Mazur et al. | |
| 7,586,601 B2* | 9/2009 | Ebstein | 356/301 |
| 2002/0034845 A1 | 3/2002 | Fujimura et al. | |
| 2002/0126333 A1 | 9/2002 | Hosono et al. | |
| 2002/0176650 A1* | 11/2002 | Zhao et al. | 385/16 |
| 2003/0025156 A1 | 2/2003 | Yamazaki et al. | |
| 2003/0029495 A1* | 2/2003 | Mazur et al. | 136/256 |
| 2003/0132449 A1 | 7/2003 | Hosono et al. | |
| 2005/0032249 A1 | 2/2005 | Im et al. | |
| 2005/0127401 A1 | 6/2005 | Mazur et al. | |
| 2006/0102901 A1 | 5/2006 | Im et al. | |
| 2010/0171948 A1* | 7/2010 | Mazur et al. | 356/301 |

OTHER PUBLICATIONS

Carey et al., "Femtosecond Laser-Assisted Microstructuring of Silicon for Novel Detector, Sensing and Display Technologies", LEOS Oct. 26, 2003 (Tuscon, AR, 2003) 481-482.

Carey et al., "Femtosecond Laser-Assisted Microstructuring of Silicon for Novel Detector, Sensing and Display Technologies", LEOS 2002 (Glasgow, Scotland, 2002) 97-98.

Carey et al., "Femtosecond-Laser-Assisted Microstructuring of Silicon Surfaces", *Optics and Photonics News*, 14, 32-36 (2003).

Crouch et al., "Infrared Absorption by Sulfur-Doped Silicon Formed by Femtosecond Laser Irradiation", *Appl. Phys. A*, 79, 1635-1641 (2004).

Crouch et al., "Comparison of Structure and Properties of Femtosecond and Nanosecond Laser-Structured Silicon", *Appl. Phys. Lett.*, 84, 1850-1852 (2004).

Dolgaev et al., "Formation of Conical Microstructures Upon Laser Evaporation of Solids", *Appl. Phys. A*, 73, 177-181 (2001).

Fowlkes et al., "Surface Microstructuring and Long-Range Ordering of Silicon Nanoparticles", *Appl. Phys. Lett.*, 80 (20), 3799-3801 (2002).

Her et al., "Novel Conical Microstructures Created in Silicon With Femtosecond Laser Pulses", CLEO 1998 (San Francisco, CA 1998) 511-512.

Hu et al., "Solar Cells from Basic to Advanced Systems," McGraw Hill Book Co., NY 1983, p. 39.

Pedraza et al., "Surface Nanostructuring of Silicon", *Appl. Phys. A*, 77, 277-284 (2003).

Pedraza et al., "Silicon Microcolumn Arrays Grown by Nanosecond Pulsed-Excimer Laser Irradiation", *Appl. Phys. Lett.*, 74 (16), 2322-2324 (1999).

Sánchez et al., "Dynamics of the Hydrodynamical Growth of Columns on Silicon Exposed to ArF Excimer-Laser Irradiation", *Appl. Phys. A*, 66, 83-86 (1998).

Sánchez et al., "Whiskerlike Structure Growth on Silicon Exposed to ArF Excimer Laser Irradiation", *Appl. Phys. Lett.*, 69 (5), 620-622 (1996).

Serpengüzel et al., "Temperature Dependence of Photoluminescence in Non-Crystalline Silicon", Photonics West (San Jose, CA 2004) 454-462.

Shen et al., "Formation of Regular Arrays of Silicon Microspikes by Femtosecond Laser Irradiation Through a Mask", *Appl. Phys. Lett.*, 82, 1715-1717 (2003).

Solar Energy Research Institute, "Basic Photovoltaic Principles and Methods," Van Nostrand Reinhold Co., NY 1984, pp. 45-47 and 138-142.

Younkin et al., "Infrared Absorption by Conical Silicon Microstructures Made in a Variety of Background Gases Using Femtosecond-Laser Pulses", *J. Appl. Phys.*, 93, 2626-2629 (2003).

Wu et al., "Visible Luminescence From Silicon Surfaces Microstructured in Air", *Appl. Phys. Lett.*, 81, 1999-2001 (2002).

Wu, C. et al., "Black Silicon a New Light Absorber," APS Centennial Meeting (Mar. 23, 1999).

Carey, et al., "Fabrication of Micrometer-Sized Conical Field Emitters Using Femto-second Laser-Assisted Etching of Silicon," Proc. IVMC 2001(Davis, CA 2001) 75-76 (2001).

Carey et al., "Field emission from Silicon Microstructures Formed by Femtosecond Laser Assisted Etching," Proc. CLEO 2001 (Baltimore, MD 2001) 555-557.

Carey et al., "High Sensitivity Silicon-Based VIS/NIR Photodetectors", Optical Society of America 2003.

Carey et al., "Femtosecond Laser-Assisted Microstructuring of Silicon for Novel Detector, Sensing and Display Technologies", LEOS Oct. 26, 2003 (Tuscon, AR, 2003) 481-482.

Carey et al., "Femtosecond Laser-Assisted Microstructuring of Silicon for Novel Detector, Sensing and Display Technologies", LEOS 2002 (Glasgow, Scotland, 2002) 97-98.

Carey et al., "Femtosecond-Laser-Assisted Microstructuring of Silicon Surfaces", Optics and Photonics News, 14, 32-36 (2003).

Crouch et al., "Infrared Absorption by Sulfur-Doped Silicon Formed by Femtosecond Laser Irradiation", *Appl. Phys. A*, 79, 1635-1641 (2004).

Crouch et al., "Comparison of Structure and Properties of Femtosecond and Nanosecond Laser-Structured Silicon", *Appl. Phys. Lett.*, 84, 1850-1852 (2004).

Dolgaev et al., "Formation of Conical Microstructures Upon Laser Evaporation of Solids", *Appl. Phys. A*, 73, 177-181 (2001).

Fowlkes et al., "Surface Microstructuring and Long-Range Ordering of Silicon Nanoparticles", *Appl. Phys. Lett.*, 80 (20), 3799-3801 (2002).

Her et al., "Novel Conical Microstructures Created in Silicon With Femtosecond Laser Pulses", CLEO 1998 (San Francisco, CA 1998) 511-512.

Hu et al., "Solar Cells from Basic to Advanced Systems," McGraw Hill Book Co., NY 1983, p. 39.

Pedraza et al., "Surface Nonstructuring of Silicon", Appl Phys. A, 77, 277-284 (2003).

Pedraza et al., "Silicon Microcolumn Arrays Grown by Nanosecond Pulsed-Excimer Laser Irradiation", *Appl. Phys. Lett.*, 74 (16), 2322-2324 (1999).

Sanchez et al., "Dynamics of the Hydrodynamical Growth of Columns on Silicon Exposed to ArF Excimer-Laser Irradiation", *Appl. Phys. A*, 66, 83-86 (1998).

Sanchez et al., "Whiskerlike Structure Growth on Silicon Exposed to Arf Excimer Laser Irradiation", *Appl. Phys. Lett.*, 69 (5), 620-622 (1996).

Serpenguzel et al., "Temperature Dependence of Photoluminescence in Non-Crystalline Silicon", Photonics West (San Jose, CA 2004) 454-462.

Shen et al., "Formation of Regular Arrays of Silicon Microspikes by Femtosecond Laser Irradiation Through a Mask", *Appl. Phys. Lett.*, 82, 1715-1717 (2003).

Solar Energy Research Institute, "Basic Photovoltaic Principles and Methods," Van Nostrand Reinhold Co., NY 1984, pp. 45-47 and 138-142.

Younkin et al., "Infrared Absorption by Conical Silicon Microstructures Made in a Variety of Background Gases Using Femtosecond-Laser Pulses", *J. Appl. Phys.*, 93, 2626-2629 (2003).

Wu et al. "Visible Luminescence From Silicon Surfaces Microstructured in Air", Appl Phys. Lett., 81, 1999-2001 (2002).

Wu, C. et al., "Black Silicon a New Light Absorber," APS Centennial Meeting (Mar. 23, 1999).

Her et al., "Microstructuring of silicon with femtosecond laser pulses," Applied Physics Letters, vol. 73, No. 12, Sep. 21, 1998.

Her, et al., "Femtosecond laser-induced formation of spikes on silicon," Applied Physics A 70, 383-385 (2000).

Wu et al., "Femtosecond laser-gas-solid interactions," These presented to the Department of Physicas at Harvard University, pp. 1-113, 126-136, Aug. 2000.

Younkin, "Surface studies and microstructure fabrication using femtosecond laser pulses," Thesis presented to the Division of Engineering & Applied sciences at Harvard University (Aug. 2001).

* cited by examiner

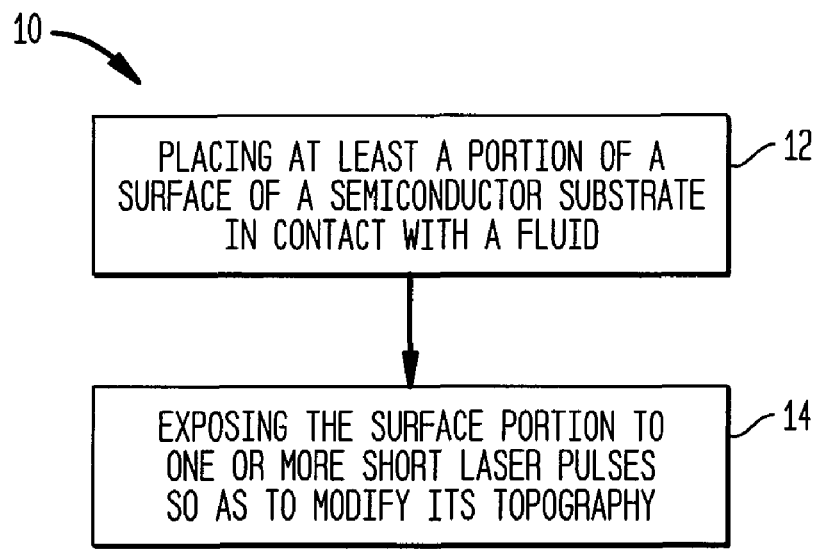
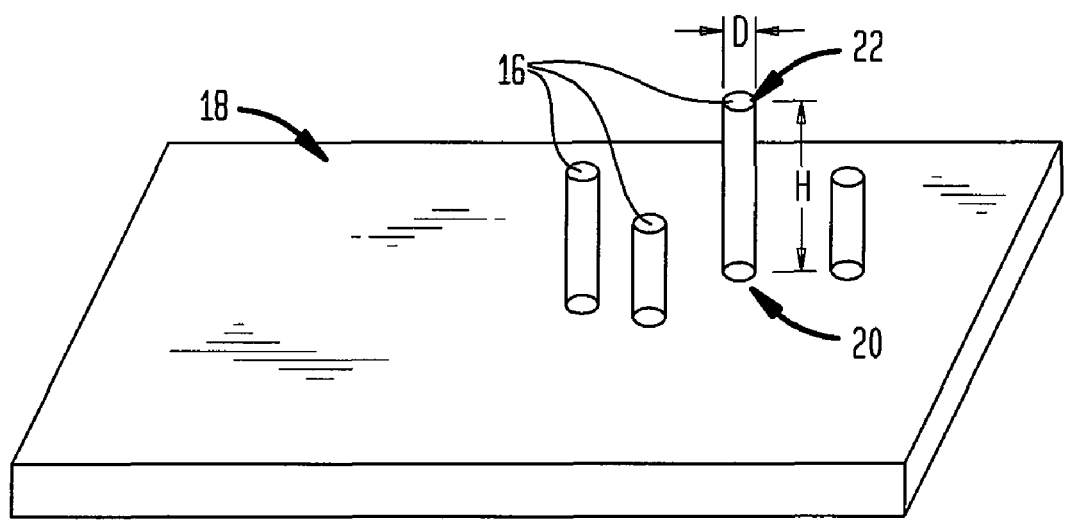

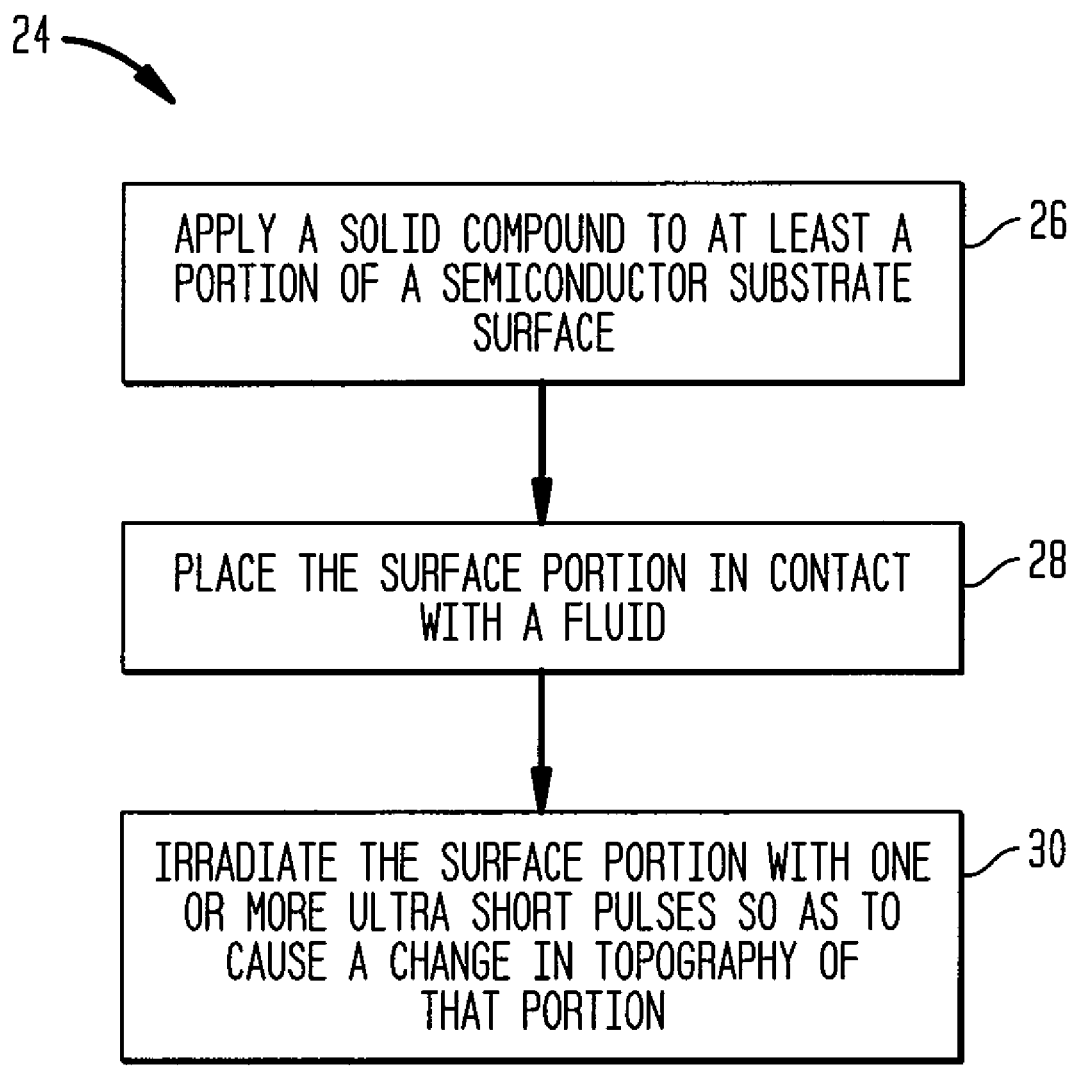

1 PULSE

2 PULSES

5 PULSES

10 PULSES

20 PULSES

50 PULSES

100 PULSES

200 PULSES

300 PULSES

400 PULSES

2μm

FEMTOSECOND LASER-INDUCED FORMATION OF SUBMICROMETER SPIKES ON A SEMICONDUCTOR SUBSTRATE

RELATED APPLICATIONS

The present application is a divisional application of U.S. patent application Ser. No. 11/196,929, which was filed on Aug. 4, 2005, and is herein incorporated by reference. This application is a continuation-in-part of U.S. patent application Ser. No. 10/950,248 entitled "Manufacture of Silicon-Based Devices Having Disordered Sulfur-Doped Surface Layers," filed on Sep. 24, 2004, and U.S. patent application Ser. No. 10/950,230, entitled " Silicon-Based Visible And Near-Infrared Optoelectric Devices," filed on Sep. 24, 2004, both of which are herein incorporated by reference in their entirety. The present application is also related to U.S. patent application Ser. No. 10/155,429, entitled " Systems and Methods for Light Absorption and Field Emission Using Microstructured Silicon," filed on May 24, 2002, which is also herein incorporated by reference in its entirety.

FEDERALLY SPONSORED RESEARCH

The invention was made with Government Support under contract DE-FC36-01GO11053 awarded by Department of Energy and under grant NSF-PHY-0117795 awarded by National Science Foundation and. The Government has certain rights in the invention.

BACKGROUND

The present invention is generally directed to methods for processing semiconductor substrates and the resultant processed substrates, and more particularly to such methods for modifying the topography of a substrate's surface.

A number of techniques are known for generating micrometer-sized structures on silicon surfaces. For example, quasi-ordered arrays of conical spikes can be formed on a silicon surface by irradiating it with high fluence laser pulses by employing, for example, the methods disclosed in the above U.S. patent applications.

There is, however, still a need for enhanced methods that allow generating even smaller structures on semiconductor surfaces, and particularly on silicon surfaces.

SUMMARY

The present invention is directed generally to methods for generating submicron-sized features on a semiconductor surface by irradiating the surface with short laser pulses. The methods allow modulating the sizes of these features by selecting the irradiation wavelength and/or placing a surface portion to be irradiated in contact with a fluid. The invention can provide formation of features that are substantially smaller in size than those generated by previous techniques. The generated features can be, for example, in the form of substantially columnar spikes, each of which extends from a base to a tip, that protrude above the surface. In many embodiments, the average height of the spikes (i.e., the average separation between the base and the tip) can be less than about 1 micron, and the spikes can have an average width—defined, for example, as the average of the largest dimensions of cross-sections of the spikes at half way between the base and the tip—that ranges from about 100 nm to about 500 nm (e.g., in a range of about 100 nm to about 300 nm).

In one aspect, the present invention provides a method of processing a semiconductor substrate that includes placing at least a portion of a surface of the substrate in contact with a fluid, and exposing that portion to one or more short laser pulses so as to modify its topography. The laser pulses can be selected to have pulse widths in a range of about 50 femtoseconds to about a few nanoseconds, and more preferably in a range of about 100 femtoseconds to about 500 femtoseconds.

In a related aspect, the laser pulses are selected to have energies in a range of about 10 microjoules to about 400 microjoules (e.g., 60 microjoules), and fluences in a range about 1 $kJ/m^2$ to about 30 $kJ/m^2$, or from about 3 $kJ/m^2$ to about 15 $kJ/m^2$, or from about 3 to about 8 $kJ/m^2$. The central wavelength of the pulses can be selected to be less than about 800 nm, and preferably in a range of about 400 nm to less than about 800 nm. The number of pulses applied to each location of the surface can be, e.g., in a range of about 1 to about 2500.

In many embodiments, utilizing irradiation wavelengths that are less than about 800 nm, e.g., 400 nm, and/or placing the irradiated portion in contact with the liquid (e.g., water) can lead to formation of sub-micron-sized features over the substrate's surface.

In further aspects, in the above method, the fluid can be selected to be any suitable polar or non-polar liquid. Some examples of such liquids include, without limitation, water, alcohol and silicon oil. Further, the semiconductor substrate can be selected to suit a particular application. By way of example, in some embodiments, the substrate can be an undoped or doped silicon wafer (e.g., an n-doped silicon wafer).

In another aspect, the invention provides a semiconductor substrate that includes a surface layer having at least a portion that exhibits an undulating topography characterized by a plurality of submicron-sized features having an average height less than about 1 micrometer and an average width in a range of about 100 nm to about 500 nm, and preferably in a range of about 100 nm to about 300 nm. The substrate can be any suitable semiconductor substrate, e.g., silicon.

In related aspects, the surface layer has a thickness in a range of about 100 nm to about 1 micrometer and the submicron-sized features comprise spikes each of which extends from a base to tip separated from the base by a distance that is less than about 1 micron. For example, the spikes can protrude above the semiconductor surface by a distance in a range of about 100 nm to about 300 nm.

In another aspect, a method of processing a silicon substrate is disclosed that includes irradiating a portion of a semiconductor surface with one or more femto-second laser pulses having a center wavelength in a range of about 400 nm to less than about 800 nm so as to generate a plurality of submicron-sized spikes within an upper layer of that surface. The spikes can have an average height less than about 1 micrometer and an average width in a range of about 100 nm to about 500 nm.

In a related aspect, in the above method, the irradiation of the surface portion is performed while that portion is in contact with a fluid. By way of example, the fluid can include a polar or non-polar liquid, or a gas, e.g., one having an electron-donating constituent.

In a related aspect, the above method further calls for disposing a solid substance having an electron-donating constituent on the surface portion that is in contact with the fluid prior to its irradiation by the laser pulses. For example, sulfur powder can be applied to the surface followed by disposing a layer of fluid (e.g., having a thickness in a range of about 1 mm to about 20 mm) on the surface. Subsequently, the surface can be irradiated by the laser pulses so as to generate the spikes within an upper layer of the surface and also generate sulfur inclusions in that layer.

In another aspect, the fluid that is in contact with the substrate's surface comprises an aqueous solution, e.g., one containing an electron-donating constituent. By way of example, the liquid can comprise sulfuric acid.

In a further aspect, a method of processing a semiconductor substrate is disclosed that includes disposing a solid substance having an electron-donating constituent on at least a portion of a surface of the substrate, and irradiating that surface portion with one or more pulses having pulse widths in a range of about 50 fs to about 500 fs so as to generate a plurality of inclusions containing the electron-donating constituent in a surface layer of the substrate. The electron-donating constituent can be, for example, a sulfur-containing substance.

Further understanding of various aspects of the invention can be obtained by reference to the following detailed description in conjunction with the associated drawings, which are described briefly below.

BRIEF DESCRIPTION OF THE DRAWINGS

FIG. 1 is a flow chart depicting various steps in one exemplary embodiment of a method according to the teachings of the invention, FIG. 2 schematically depicts a semiconductor substrate on a surface of which a plurality of submicron-sized spikes are formed in accordance with the teachings of the invention, FIG. 3 is a flow chart depicting steps in another exemplary embodiment of a method according to the teachings of the invention for changing topography of a semiconductor surface.

DETAILED DESCRIPTION

Figure 4:
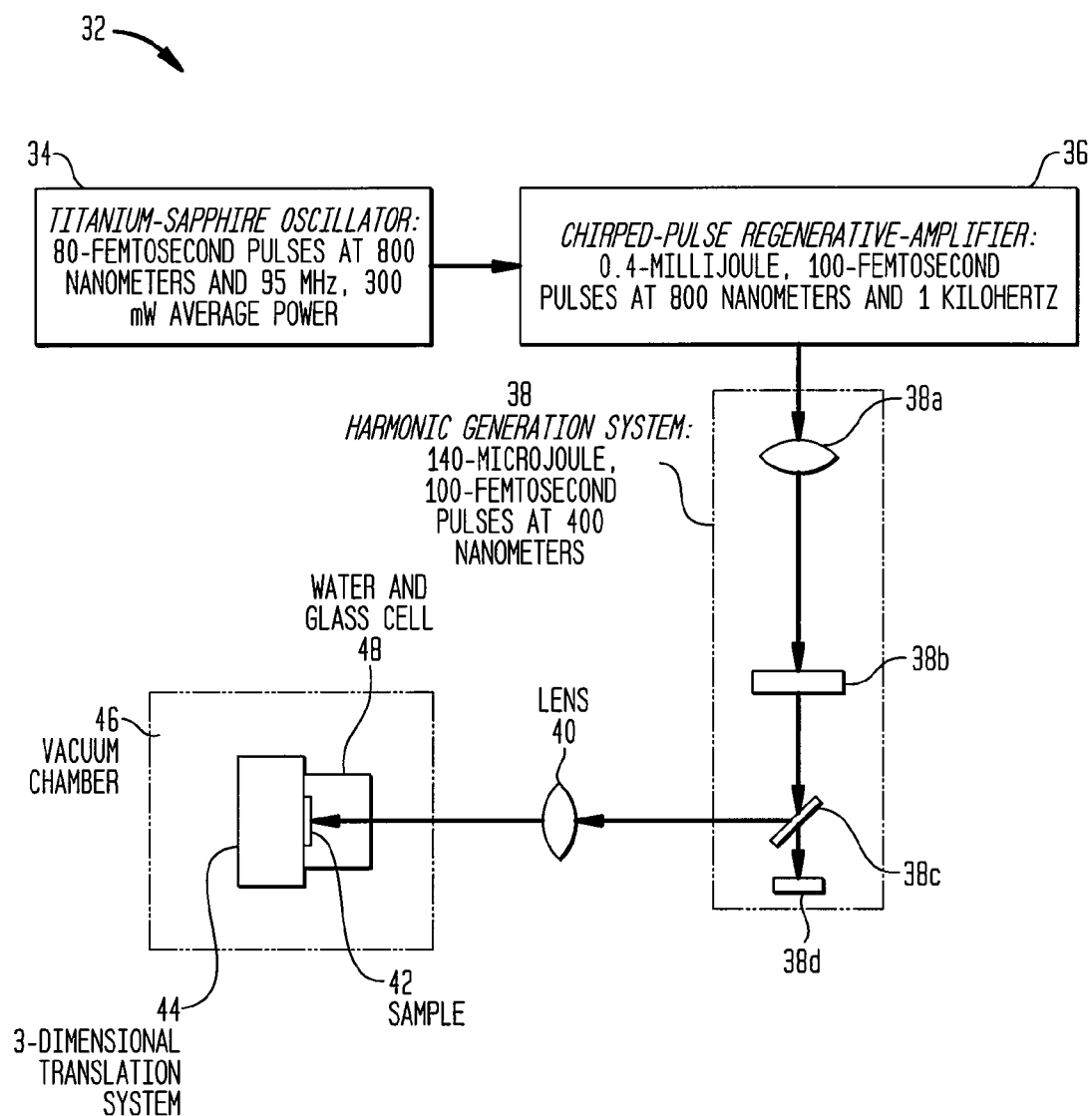
FIG. 4 is a schematic diagram of an exemplary apparatus suitable for use in practicing the processing methods of the invention.

The present invention generally provides semiconductor substrates having surfaces that exhibit submicron-sized structures, and methods for generating such structures. In many embodiments, the submicron-sized structures are generated by irradiating a semiconductor substrate's surface with ultra short laser pulses (e.g., femtosecond pulses) while maintaining the surface in contact with a fluid (e.g., water). Exemplary embodiments of the invention are discussed below.

With reference to a flow chart 10 of FIG. 1, in one exemplar embodiment of a method according to the teachings of the invention for processing a semiconductor substrate, in a step 12, at least a portion of the substrate surface is placed in contact with a fluid, for example, by disposing a layer of the fluid over that portion. In another step 14, the substrate portion that is in contact with the fluid is exposed to one or more short laser pulses so as to modify its surface topography. The laser pulses can have pulse widths in a range of about 100 fs to about a few ns, and more preferably in a range of about 100 fs to about 500 fs. In this exemplary embodiment, the center wavelength of the pulses is chosen to be about 400 nm. More generally, wavelengths in a range of about 400 nm to less than about 800 nm can be employed. The pulse energies can be in a range of about 10 microjoules to about 400 microjoules, and preferably in a range of about 60 microjoules to about 100 microjoules.

The modification of the surface topography can include generating submicron-sized features in an upper surface layer of the substrate. For example, the submicron-sized features can include a plurality of microstructured spikes, e.g., columnar structures extending from the surface to a height above the surface. FIG. 2 schematically depicts a plurality of such features (also referred to herein as spikes) 16 formed on a semiconductor substrate surface 18. Each spike can be characterized by a height and a width (the spikes are shown only for illustrative purposes and are not intended to indicate actual density, size or shape). For example, a spike 16a has a height H defined as the separation between its base 20 and its tip 22, and a width defined by a diameter D of a cross-section, e.g., one substantially parallel to the substrate surface, at a location half way between the base and the tip. In case of irregularly shaped spikes, the width can correspond, e.g., to the largest linear dimension of such a cross-section of the spike. In many embodiments, the submicron-sized features exhibit an average height of about 1 micrometer (e.g., a height in a range of about 200 nm to about 1 micrometer) and an average width in a range of about 100 nm to about 500 nm, or in a range of about 100 m to about 300 nm.

In general, the fluid is selected to be substantially transparent to radiation having wavelength components in a range of about 400 nm to about 800 nm. Further, the thickness of the fluid layer is preferably chosen so as to ensure that it would not interfere with the laser pulses (e.g., via excessive self-focusing of the pulses) in a manner that would inhibit irradiation of the substrate surface. While in this embodiment water is selected as the fluid, in other embodiments other fluids, such as alcohol or silicon oil, can be employed.

In some embodiments, at least a portion of the substrate can be placed in contact with an aqueous solution having an electron-donating constituent. For example, a solution of sulfuric acid can be applied to at least a portion of the substrate followed by irradiating that portion with short pulses (e.g., femto-second pulses) to not only cause a change in surface topography in a manner described above but also generate sulfur inclusions within a surface layer of the substrate.

Referring to a flow chart 24 of FIG. 3, in another embodiment, initially a solid compound, e.g., sulfur powder, is applied to at least a portion of a semiconductor substrate surface (e.g., a surface of a silicon wafer) (step 26). Subsequently, in a step 28, that surface portion is placed in contact with a fluid (e.g., water) and is irradiated (step 30) by one or more short laser pulses (e.g., pulses with pulse widths in a range of about 100 fs to about a few ns, and preferably in a range of about 100 fs to about 500 fs) so as to cause a change in topography of that portion. Similar to the previous embodiment, the pulse energies can be chosen to be in a range of about 10 microjoules to about 400 microjoules (e.g., 10-150 microjoules).

FIG. 4 schematically depicts an exemplary apparatus 32 suitable for performing the above methods of processing a semiconductor substrate. The apparatus 32 includes a Titanium-Saphhire (Ti:Sapphire) laser 34 that generates laser pulses with a pulse width of 80 femtoseconds at 800 nm wavelength having an average power of 300 mW and at a repetition rate of 95 MHz. The pulses generated by the Ti:Sapphire laser are applied to a chirped-pulse regenerative amplifier 36 that, in turn, produces 0.4 millijoule (mJ), 100 femtosecond pulses at a wavelength of 800 nm and at a repetition rate of 1 kilohertz.

The apparatus 32 further includes a harmonic generation system 38 that receives the amplified pulses and doubles their frequency to produce 140-microjoule, 100-femtosecond second-harmonic pulses at a wavelength of 400 nanometers. The harmonic generation system can be of the type commonly utilized in the art. For example, it can include a lens 38a for focusing the incoming pulses into a doubling crystal 38b to cause a portion of the incoming radiation to be converted into second-harmonic pulses. A dichroic mirror 38c can direct the second-harmonic pulses to a lens 40, and a beam stop 38d can absorb the portion of the radiation that remains at the fundamental frequency.

The lens 40 focuses the second-harmonic pulses onto a surface of a sample 42 (e.g., a silicon wafer) disposed on a 3-dimensional translation system 44 within a vacuum chamber 46. A glass liquid cell 48 is coupled to the stage over the sample so as to allow a sample surface to have contact with the fluid (e.g., water) contained within the cell. The three-dimensional stage allows moving the sample relative to the laser pulses for exposing different portions of the surface to radiation. The vacuum chamber can be utilized to pump out air bubbles in the fluid. Alternatively, the processing of the sample can be performed without utilizing a vacuum chamber.

To illustrate the efficacy of the teachings of the invention and only for illustrative purposes, submicrometer-sized silicon spikes were generated in surface layers of silicon wafers submerged in water by irradiating those surfaces with 400-nm, 100-fs laser pulses. For example, a Si (111) wafer was initially cleaned with acetone and rinsed in methanol. The wafer was placed in a glass container, such as the container 48 described above, that was filled with distilled water and mounted on a three-axis stage. The silicon surface in contact with the water was irradiated by a 1-KHz train of 100-fs, 60-microjoule pulses at a central wavelength of 400 nm generated by a frequency-doubled, amplified Ti:Sapphire laser, such as that described above. A fast shutter was utilized to control the number of laser pulses incident on the silicon surface. The laser pulses were focused by a 0.25-m focal-length lens to a focal point about 10 mm behind the silicon surface. The pulses traveled through about 10 mm of water before striking the silicon surface at normal incidence. The spatial profile of the laser spot at the sample surface was nearly Gaussian characterized by a fixed beam waist of about 50 microns. To correct for chirping of the laser pulses in the water and to ensure minimum pulse duration at the silicon surface, the pulses were pre-chirped to obtain the lowest possible damage threshold at that surface. The results, however, did not depend strongly on the chirping of the laser pulses.

During sample irradiation, the irradiated sample surface was monitored with an optical imaging system having a spatial resolution of about 5 microns. It was observed that irradiation cause formation of micrometer-sized water bubbles at the silicon-water interface. After a single pulse, two or three microbubbles were generated; after irradiation with trains of laser pulses thousands of bubbles were generated. It was also observed that some bubbles at times would coalesce to form larger ones, which would adhere to the silicon surface. These larger bubbles were removed by shaking the cell.

Figure 5A:
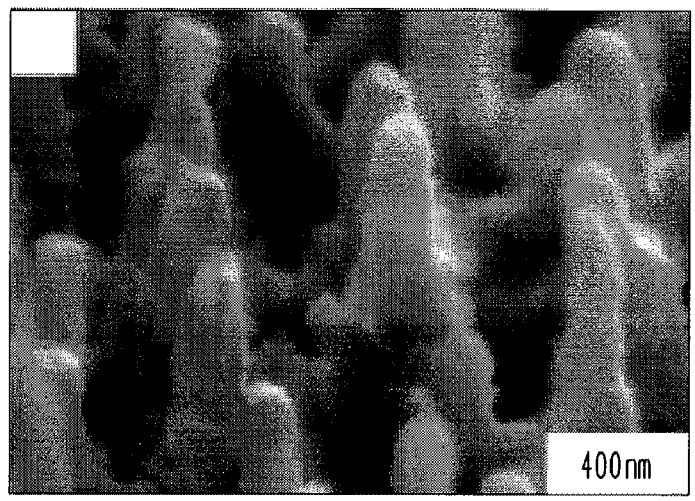
FIGS. 5A and 5B are scanning electron micrographs of silicon spikes formed on a silicon surface viewed at 45° angle relative to a normal to the surface, formed by placing the surface in contact with distilled water and irradiating it with 100-fs, 400-nm, 60-μJ laser pulses.
Figure 5B:
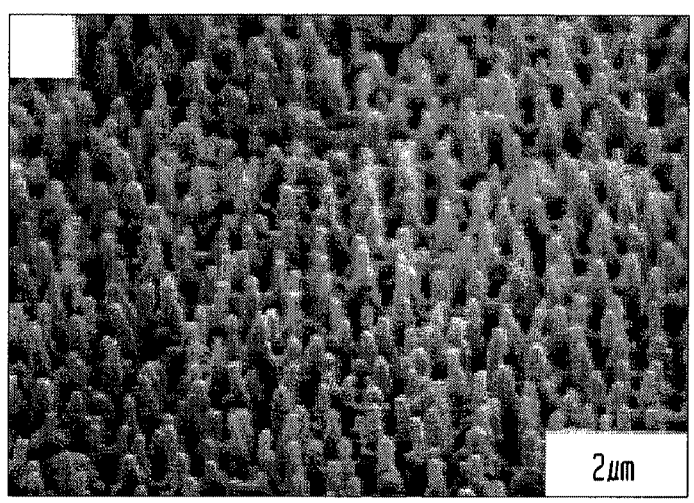
Figure 5C:
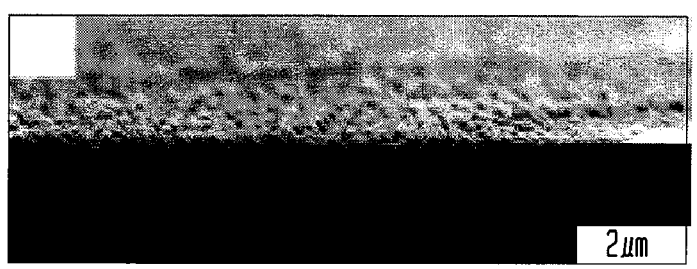
FIG. 5C is a scanning electron micrograph of the spikes shown in FIGS. 5A-5B viewed from the side.

FIGS. 5A, 5B, and 5C present electron micrographs of the silicon surface after irradiation with one thousand laser pulses, showing formation of a plurality of spikes on the surface. The spikes have a substantially columnar shape with a typical height of about 500 nm and a typical diameter of about 200 nm. They protrude up to about 100 nm above the original surface of the wafer (FIG. 1C). The shape of the spikes is more columnar than the conical spikes that can be formed in the presence of $SF_6$, as disclosed in the above-referenced patent applications.

Figure 6A:
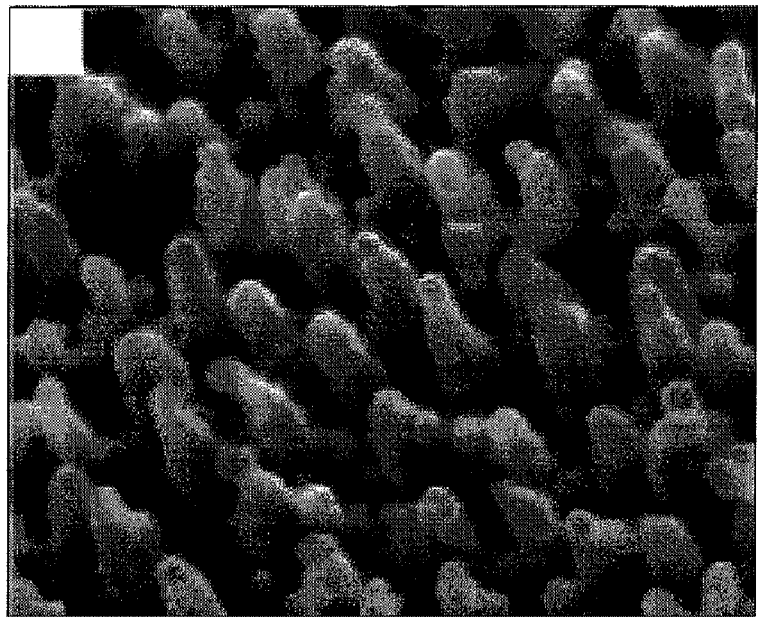
FIG. 6A is another scanning electron micrograph of silicon spikes formed in distilled water by irradiating a silicon surface with femtosecond pulses before etching the surface to remove an upper silicon oxide layer.
Figure 6B:
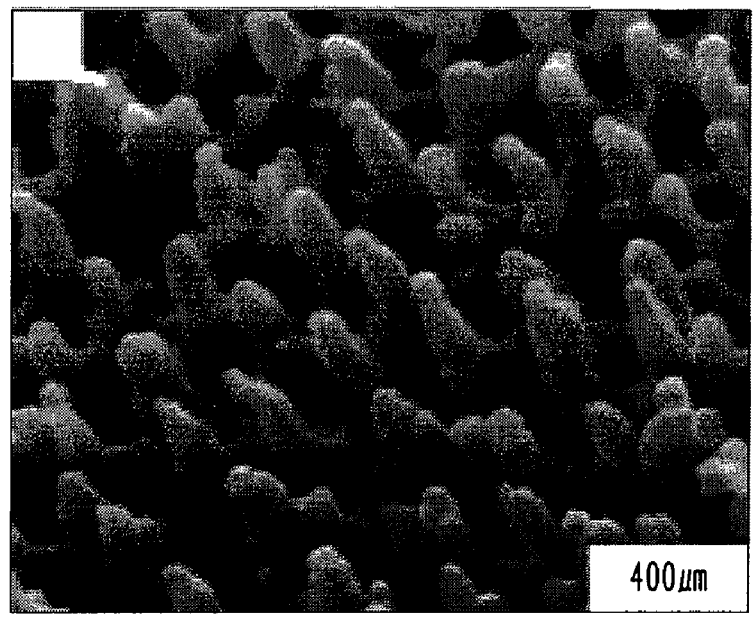
FIG. 6B is a scanning electron micrograph of the silicon spikes of FIG. 6A after having been subjected to etching in HF.

The chemical composition of the uppermost 10 nm of the silicon surface layer having the spikes was determined by employing X-ray photoelectron spectroscopy (XPS). The XPS spectra showed that this layer is composed of about 83% $SiO_2$ and about 17% silicon. The wafer was etched in 5% HF for about 15 minutes to remove the $SiO_2$ layer (about 20 nm in thickness) while leaving the underlying unoxidized Si intact. A comparison of the electron micrographs of the spikes before etching (FIG. 6A) with those obtained after etching (FIG. 6B) showed that the etching process had reduced the width of the spikes by about 40 nm and had rendered their surfaces smoother. After etching, no $SiO_2$ was detected in the X-ray photoelectron spectra of the sample, thereby indicating that the interior of the spikes consisted of silicon and that the spikes were covered prior to etching by an oxide layer that was at most about 20 nm thick.

Figure 7A:
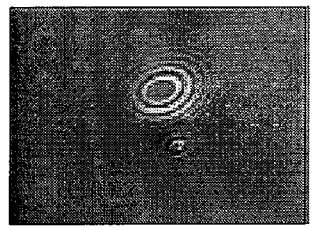
FIGS. 7A-7J are scanning electron micrographs of a silicon surface irradiated while in contact with distilled water by an increasing number of laser pulses (the width of the irradiated area is approximately 50 μm).

To study the development of the spikes, silicon samples were irradiated with different numbers of laser pulses. FIGS. 7A-7J show a series of scanning electron micrographs of the surface of a silicon substrate irradiated with an increasing number of femtosecond laser pulses while in contact with water, in a manner described above. The images only show the central portion of the irradiated area. As shown in FIG. 7A, a single laser pulse forms surface structures resembling ripples on a liquid surface with a wavelength of about 500 nm. Lower magnification micrographs (not shown here) indicate that the irradiated region typically contains two or three of these ripple-like structures. Without being limited to any particular theory, each ripple structure is likely to correspond to one of the microbubbles that were observed after irradiation.

Figure 7B:
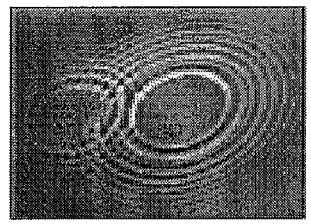
Figure 7C:
Figure 7D:
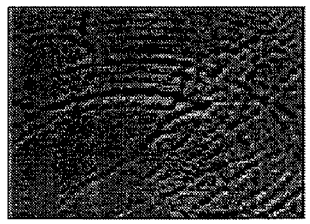
Figure 7E:
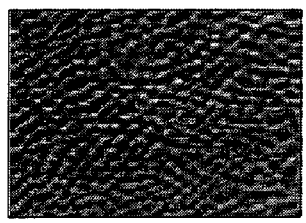
Figure 7F:
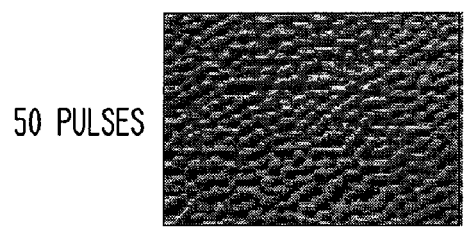
Figure 7G:
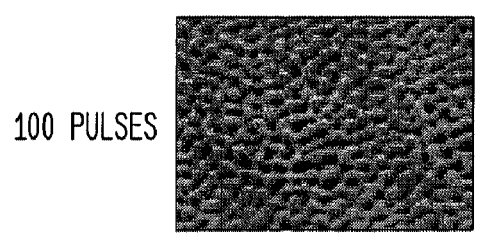
Figure 7H:
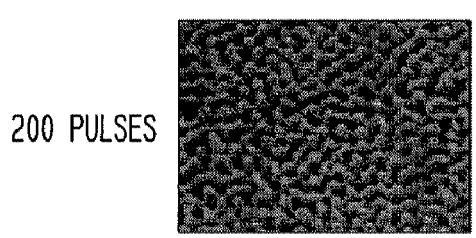
Figure 7I:
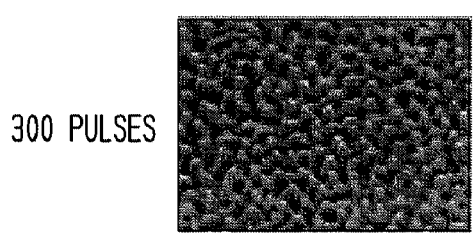
Figure 7J:
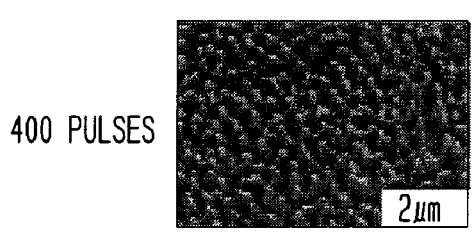

Referring to FIG. 7B, after two pulses, the surface shows overlapping ripple structures. As the number of laser pulses is increased from 5 to 20 (FIGS. 7C, 7D and 7E), the silicon surface roughens from the interaction of many ripple structures. After exposure to 50 laser pulses (FIG. 7F), the surface is covered with submicrometer bead-like structures, which then evolve into spikes as the number of pulses is further increased as shown in FIGS. 7G, 7H, 7I and 7J corresponding, respectively, to irradiating the surface with 100, 200, 300 and 400 laser pulses. The average separation of the resulting spikes is roughly 500 nm and substantially equal to the wavelength of the initial ripple structures.

The above silicon spikes prepared in water are one to two orders of magnitude smaller than spikes that can be generated in a silicon substrate exposed to laser pulses in presence of a gas, such as those described in the above-referenced copending patent applications. This remarkable size difference suggests different formation mechanisms for the two types of spikes.

Without being limited to any particular theory, it is noted that when a 400-nm laser pulse interacts with the silicon surface, most of the light is absorbed by a silicon layer tens of nanometers thick near the silicon-water interface. The absorption of intense light in such a thin silicon layer can excite a plasma at the silicon-water interface, which can then equilibrate with the surrounding water and silicon, leaving behind a molten silicon layer on the surface. The molten layer can solidify before the next laser pulse arrives. Due to the high temperature of the plasma, some of the water can vaporize or dissociate, thereby generating bubbles at the silicon-water interface. The large bubbles that were observed after irradiation in the above experiments remain in the water for days, thus suggesting that they consist primarily of gaseous hydrogen and oxygen rather than water vapor.

Again, without being limited to any particular theory, several possible mechanisms can be considered by which the bubbles may produce the wave-like structures shown in FIGS. 7A-7J. Diffraction of the laser beam by the bubbles may produce rings of light intensity on the silicon surface, or the heat of vaporization and dissociation required to form a bubble at the silicon-water interface may cool the silicon surface locally, exciting a capillary wave in the molten silicon through Marangoni flow. The latter is the most likely formation mechanism for the structures observed after a single pulse; those structures cannot be formed by diffraction from a laser-induced bubble, as the pulse duration is only 100 fs, and the observed wave-like structures can be several micrometers in diameter. A micrometer-sized bubble requires much longer than 100 fs to form and therefore cannot diffract the first pulse.

Roughness on the silicon surface can cause an uneven absorption of the laser pulse energy across the surface. The resulting non-uniform temperature of the surface can produce a random arrangement of bubbles. Silicon-water has a contact angle more than 45°, making a gaseous layer between the silicon and water unstable and leading to the formation of bubbles. The vaporization and dissociation of the bubbles can remove thermal energy from the molten silicon surface just below the bubbles, causing the surface to cool rapidly. Because the surface tension of liquid silicon decreases with increasing temperature, the surrounding hot liquid silicon flows toward the cooled region, deforming the surface. This deformation can then excite a circular capillary wave at the liquid-silicon surface. Superposition of ripple-structures caused by multiple laser pulses can then produce the randomly distributed submicrometer beads that appear after 20 laser pulses (See FIGS. 7F-7J). These beads subsequently sharpen into spikes through preferential removal of material around the beads by laser-assisted etching.

As noted above, the morphology and sizes of the above spikes generated in a silicon surface by exposing it to femtosecond laser pulses while in contact with water can be different than those observed for spikes generated by irradiating a silicon surface with femtosecond pulses in presence of a gas, such as $SF_6$. The early stage of submicrometer spike formation in water can be different from that in gaseous $SF_6$, while the later stages can be similar. In $SF_6$, straight submicrometer-sized ripple structures first form on the silicon surface, then coarser, micrometer-scale ridges form on top of (and perpendicular to) the ripples. Next, the coarsened layer breaks up into micrometer-sized beads, and finally the beads evolve into spikes through etching. In both $SF_6$ and water, the length scale of the final structures is set by the arrangement of beadlike structures that form after roughly 10-20 pulses, and this length scale appears to be determined by capillary waves in the molten silicon. The much smaller size of the spikes formed in water is likely to be due to a difference in capillary wavelength in the two cases.

The molten silicon layer is expected to solidify much faster in water than in $SF_6$, as the thermal conductivity and heat capacity of liquid water are much greater than those of gaseous $SF_6$. The dispersion relation for capillary waves in a shallow layer of molten silicon indicates that decreasing the lifetime of the molten layer should also decrease the longest allowed capillary wavelength. Using a simple model that neglects the effects of ablation and cooling by heat transfer to the environment to calculate the lifetime and depth of the liquid layer, it was found that the longest allowed capillary wavelength is about 1 micron. Because the lifetime is certainly reduced by the flow of heat to the surrounding water in the experiments presented above, the longest allowed wavelength should be less than 1 micron, which is in agreement with submicrometer spike separation observed here.

In some embodiments, rather than utilizing a fluid, a solid substance having an electron-donating constituent (e.g., a sulfur powder) is disposed on at least a portion of a surface of semiconductor substrate, e.g., a silicon wafer. That surface portion is then irradiated with one or more pulses having pulse widths in a range of about 50 fs to about 500 fs so as to generate a plurality of inclusions containing the electron donating constituent in a surface layer of the substrate.

Those having ordinary skill in the art will appreciate that various changes can be made to the above embodiments without departing from the scope of the invention.

What is claimed is:

1. A semiconductor substrate, comprising
   a surface layer having at least a portion exhibiting an undulating topography characterized by a plurality of submicron-sized features having an average height less than about 1 micrometer and an average width in a range of about 100 nm to about 500 nm.

2. The semiconductor substrate of claim 1, wherein said substrate comprises a silicon wafer.

3. The semiconductor substrate of claim 1, wherein said substrate comprises an n-doped silicon wafer.

4. The semiconductor substrate of claim 1, wherein said surface layer has a thickness in a range of about 20 nm to about 1 micrometer.

5. The semiconductor substrate of claim 1, wherein said submicron-sized features comprise spikes extending from a base to a tip separated from the base by a distance less than about 1 micrometer.

6. The semiconductor substrate of claim 5, wherein said spikes protrude above the semiconductor surface by a distance in a range of about 100 nm to about 300 nm.

7. The semiconductor substrate of claim 1, wherein said submicron-sized features are generated by irradiating a surface of the substrate with short laser pulses.

8. The semiconductor substrate of claim 7, wherein said short laser pulses have pulse widths in a range of about 50 femtoseconds to about a few nanoseconds.

9. The semiconductor substrate of claim 7, wherein said short laser pulses have pulse widths in a range of about 50 femtoseconds to about 500 femtoseconds.

10. The semiconductor substrate of claim 7, wherein said short laser pulses can have a pulse energy in a range of about 10 microjoules to about 400 microjoules.

11. The semiconductor substrate of claim 1, wherein said submicron-sized features have an average width in a range of about 100 nm to about 300 nm.

* * * * *